United States Patent
Wang et al.

(10) Patent No.: US 10,101,626 B2
(45) Date of Patent: Oct. 16, 2018

(54) ARRAY SUBSTRATE, DISPLAY PANEL, DISPLAY DEVICE, AND METHOD FOR FABRICATING ARRAY SUBSTRATE

(71) Applicants: Boe Technology Group Co., Ltd., Beijing (CN); Beijing Boe Display Technology Co., Ltd., Beijing (CN)

(72) Inventors: Shoukun Wang, Beijing (CN); Huibin Guo, Beijing (CN); Yuchun Feng, Beijing (CN); Liangliang Li, Beijing (CN); Tsungchieh Kuo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/324,053

(22) PCT Filed: Jan. 29, 2016

(86) PCT No.: PCT/CN2016/072672
§ 371 (c)(1),
(2) Date: Jan. 5, 2017

(87) PCT Pub. No.: WO2017/045334
PCT Pub. Date: Mar. 23, 2017

(65) Prior Publication Data
US 2017/0307919 A1    Oct. 26, 2017

(30) Foreign Application Priority Data
Sep. 16, 2015    (CN) .......................... 2015 1 0588132

(51) Int. Cl.
*H01L 33/00*    (2010.01)
*G02F 1/136*    (2006.01)
(Continued)

(52) U.S. Cl.
CPC ...... *G02F 1/1368* (2013.01); *G02F 1/134309* (2013.01); *G02F 1/136286* (2013.01);
(Continued)

(58) Field of Classification Search
CPC ............. G02F 1/1368; G02F 1/134309; G02F 2001/136295; G02F 2001/13629;
(Continued)

(56) References Cited

U.S. PATENT DOCUMENTS 8,310,612 B2 * 11/2012 Cho .................. G02F 1/136227
349/138
2011/0221733 A1    9/2011 Sato
(Continued)

FOREIGN PATENT DOCUMENTS

CN    101136427    3/2008
CN    101609236    12/2009
(Continued)

OTHER PUBLICATIONS

International Search Report for PCT/CN2016/072672 dated Jun. 21, 2016.
(Continued)

*Primary Examiner* — Natalia Gondarenko
(74) *Attorney, Agent, or Firm* — Calfee, Halter & Griswold LLP

(57) ABSTRACT

An array substrate, a display panel, a display device, and a method for fabricating an array substrate are provided. The array substrate comprises gate lines and data lines on a substrate plate which are insulated from each other and intersect to define sub-pixel units, and the data lines comprise a first data line and a second data line which are arranged side by side between two neighboring columns of sub-pixel units. Between two of the sub-pixel units which are neighbors in a column direction, at least a portion of the
(Continued)

first data line is arranged in a layer different from the neighboring second data line. At least a part of the first data line is arranged in a layer different from that of the neighboring second data line, to overcome the problem of short circuit between dual data lines.

9 Claims, 8 Drawing Sheets

(51) Int. Cl.
*G02F 1/1343* (2006.01)
*G02F 1/1368* (2006.01)
*G02F 1/1362* (2006.01)
*H01L 27/12* (2006.01)
*G06F 3/038* (2013.01)
*G09G 3/36* (2006.01)
*G09G 3/20* (2006.01)

(52) U.S. Cl.
CPC .......... *H01L 27/124* (2013.01); *H01L 27/127* (2013.01); *G02F 2001/13629* (2013.01); *G02F 2001/134345* (2013.01); *G02F 2001/136295* (2013.01); *G02F 2201/123* (2013.01)

(58) Field of Classification Search
CPC ... G02F 2001/134345; G02F 2201/123; G02F 1/13; G02F 1/133; G02F 1/1345; G02F 1/136–1/13624; G02F 1/136286–1/1365; G02F 1/134327; G02F 1/136213–1/136227; H01L 27/124; H01L 27/127; H01L 29/41733; H01L 29/42384; H01L 27/12–27/1255; H01L 27/1214–27/1296; H01L 27/24; H01L 27/32–27/3297; H01L 2021/775; H01L 51/50–51/56; H01L 2227/32–2227/326; H01L 2251/566; H01L 2924/13069
USPC ......... 257/72; 345/211, 87, 92, 960; 349/42, 349/43, 47, 52, 138, 139, 48
See application file for complete search history.

(56) References Cited

U.S. PATENT DOCUMENTS

| | | | |
|---|---|---|---|
| 2012/0050657 A1* | 3/2012 | Lin | G02F 1/136286 349/139 |
| 2016/0293631 A1 | 10/2016 | Sun et al. | |
| 2017/0018574 A1* | 1/2017 | Jeong | H01L 27/1237 |
| 2017/0033173 A1* | 2/2017 | Kim | H01L 27/3276 |

FOREIGN PATENT DOCUMENTS

| | | |
|---|---|---|
| CN | 103745970 | 4/2014 |
| CN | 104699349 A | 6/2015 |
| CN | 105068349 | 11/2015 |
| JP | 2000235195 | 8/2000 |

OTHER PUBLICATIONS

First Office Action for Chinese Patent Application No. 201510588132.5 dated Sep. 19, 2017.
Second Office Action for Chinese Patent Application No. 201510588132.5 dated May 3, 2018.

* cited by examiner

ARRAY SUBSTRATE, DISPLAY PANEL, DISPLAY DEVICE, AND METHOD FOR FABRICATING ARRAY SUBSTRATE

RELATED APPLICATIONS

The present application is the U.S. national phase entry of PCT/CN2016/072672, with an international filing date of Jan. 29, 2016, which claims the benefit of Chinese Patent Application No. 201510588132.5, filed on Sep. 16, 2015, the entire disclosures of which are incorporated herein by reference.

TECHNICAL FIELD

The present disclosure relates to the field of display, and particularly to an array substrate, a display panel, a display device, and a method for fabricating the array substrate.

BACKGROUND

Currently in a variety of TFT-LCD (thin film transistor—liquid crystal display) products, data lines are designed in as dual data lines to improve the frequency for outputting signal. As shown in FIG. 1, a display panel in LCD comprises an array substrate 1'. The array substrate 1' comprises gate lines 20' and data lines which are arranged on a substrate plate (not shown) and intersect to define sub-pixel units 30'. A thin film transistor 40' and a pixel electrode 50' are formed in each of the sub-pixel units 30'. The thin film transistor 40' comprises a gate 40a', a source 40b', and a drain 40c'. The data lines comprise a first data line 61' and a second data line 62' which are arranged side by side between every two neighboring columns of sub-pixel units 50'. As shown, the first data line 61' and the second data line 62' are arranged in a same layer as the source 40b' and drain 40c' of the thin film transistor 40'. A dual-data-line short circuit (DDS) tends to occur between the first data line 61' and the second data line 62' which are arranged side by side. Especially in case a distance between the first data line 61' and the second data line 62' is relatively small, the problem of DDS become worse, which may lead to significant decrease in the yield of product.

Therefore, there is a desire for a display panel capable of preventing DDS in the art.

SUMMARY

In a first aspect, it is provided an array substrate, comprising gate lines and data lines on a substrate plate which are insulated from each other and intersect to define sub-pixel units, wherein a thin film transistor and a pixel electrode hare formed in each of the sub-pixel units, the data lines comprise a first data line and a second data line which are arranged side by side between two neighboring columns of sub-pixel units, wherein in every two neighboring columns of sub-pixel units, sub-pixel units in odd rows are connected with the first data line, and sub-pixel units in even rows are connected with the second data line, wherein between two of the sub-pixel units which are neighbors in a column direction, at least a portion of the first data line is arranged in a layer different from the neighboring second data line.

According to this embodiment, at least a part of the first data line is arranged in a different layer from that of the neighboring second data line. In this manner, DDS can be effectively prevented, thus improving the yield of product. Cross-talk between dual data lines which are arranged side by side can be significantly eliminated, thus improving the display quality of product. A small distance between dual data lines can be realized, thus improving the aperture ratio and wiring density of the array substrate.

In an emeplary embodiment, the first data line comprises first segments and second segments which are arranged alternately, each first segment and each second segment are arranged in a same layer as a gate of the thin film transistor, and each first segment and an adjacent second segment are electrically connected with each other by a first electrically connecting part; and the second data line is arranged in a same layer as the source and drain of the thin film transistor.

According to this embodiment, the first data line is divided into segments, each first segment and second segment of the first data line are arranged in a same layer as the gate, and each first segment and the adjacent second segment are electrically connected with each other by a first electrically connecting part. The second data line is a conventional data line, i.e., a continuous data line which is arranged in a same layer as the source and drain. In this manner, each first segment and second segment of the first data line are arranged in a different layer from that of the second data line, thus effectively preventing short circuit and cross-talk between dual data lines which are arranged side by side.

In an exemplary embodiment, each first segment of the first data line is provided with first via holes which are arranged at both ends of each first segment in its extending direction along the first data line and penetrate a gate insulating layer and a passivation layer of the thin film transistor;

each second segment of the first data line is provided with second via holes which are arranged at both ends of the second segment in its extending direction along the first data line and penetrate the gate insulating layer and the passivation layer;

a third via hole is arranged over the source and drain of the thin film transistor and penetrate the passivation layer; and the first electrically connecting part is electrically connected with the source and drain, each first segment of the first data line and the second segment adjacent with the first segment, through the first via holes, the second via holes and the third via hole.

According to this embodiment, the first electrically connecting part electrically connects the first segments of the first data line and the adjacent second segments to the source and drain of the thin film transistor, through the adjacent first via holes and second via holes in the first segments and second segments of the first data line as well as the corresponding third via hole over the source and drain, so that a complete first data line is formed. The first via holes, the second via holes, and third via hole can be formed in a same patterning process, which facilitates simplifying the process step. Alternatively, a planarization layer is further arranged over the passivation layer in the thin film transistor. In this case, the first via holes, the second via holes, and the third via hole accordingly further penetrate the planarization layer.

In an exemplary embodiment, the first data line comprises first segments and second segments which are arranged alternately, the first segments are arranged in a same layer as a source and drain of the thin film transistor, the second segments are arranged in a same layer as a gate of the thin film transistor, and each first segment is electrically connected with an adjacent second segment through a second electrically connecting part.

According to this embodiment, first segments and second segments of the first data line are arranged alternately, the first segments are arranged in a same layer as the source and drain, and the second segments are arranged in a same layer as the gate. In this manner, the first segments and second segments of the first data line are arranged in different layers, which facilitates at least partially arranging the first data line and the second data line in different layers, and further prevents short circuit and cross-talk between dual data lines which are arranged side by side.

In an exemplary embodiment, the second data line is arranged in a same layer as the source and drain of the thin film transistor.

According to this embodiment, the first segments and second segments of the first data line are arranged alternately, the first segments are arranged in a same layer as the source and drain, while the second segments are arranged in a same layer as the gate. The second data line is arranged in a same layer as the source and drain. In this manner, the second segments of the first data line are arranged in a different layer from the second data line, thus preventing short circuit and cross-talk between dual data lines which are arranged side by side.

In an exemplary embodiment, each first segment of the first data line is provided with fourth via holes which are arranged at both ends of each first segment in its extending direction along the first data line, and penetrate a passivation layer of the thin film transistor;

each second segment of the first data line is provided with fifth via holes which are arranged at both ends of the second segment in its extending direction along the first data line, and penetrate a gate insulating layer and the passivation layer; and the second electrically connecting part is electrically connected with each first segment of the first data line and the second segment adjacent with the first segment, through the fourth via holes and the fifth via holes.

According to this embodiment, the second electrically connecting part electrically connects each first segment and the adjacent second segment of the first data line, through adjacent fourth via holes and fifth via holes of the first segments and second segments, so that a complete first data line is formed. The fourth via holes and fifth via holes can be formed in a same patterning process, which facilitates simplifying process steps. In the present embodiment, since first segments of the first data line is arranged in a same layer as the source and drain of the thin film transistor, the second electrically connecting part forms a complete first data line through the fourth via holes in the first segments of the first data line and the fifth via holes in the second segments of the first data line. As compared with the above embodiment in which the third via hole is comprised, it is not necessary to form via holes over the source and drain of the thin film transistor in this technical solution. Namely, the number of via holes is reduced. Alternatively, in case a planarization layer is further arranged over the passivation layer in the thin film transistor, the fourth via holes and the fifth via holes accordingly further penetrate the planarization layer.

In an exemplary embodiment, the second data line comprises first segments and second segments which are arranged alternately;

the first segments of the second data line and the first segments of the first data line are arranged side by side, and are arranged in a same layer as the gate of the thin film transistor;

the second segments of the second data line and the second segments of the first data line are arranged side by side, and are arranged in a same layer as the source and drain of the thin film transistor; and the first segments of the second data line are electrically connected with the second segments of the second data line through a third electrically connecting part.

According to this embodiment, not only the first data line is divided into segments, but also the second data line is divided into segments. The first data line comprises first segments which are arranged in a same layer as the source and drain and second segments which are arranged in a same layer as the gate, and the second data line comprises first segments which are arranged in a same layer as the gate and second segments which are arranged in a same layer as the source and drain. The first segments of the second data line and the first segments of the first data line are arranged side by side, and the second segments of the second data line and the second segments of of first data line are arranged side by side. Therefore, the first segments of the first data line are arranged in a different layer from the first segments of the second data line, and the second segments of the first data line are arranged in a different layer from the second segments of the second data line. In this manner, segments of the first data line and second data line which are arranged side by side are also arranged in different layers, thus effectively preventing short circuit and cross-talk between dual data lines which are arranged side by side.

In an exemplary embodiment, each first segment of the second data line is provided with sixth via holes at both ends in its extending direction of the second data line, and the sixth via holes penetrate a gate insulating layer and a passivation layer of the thin film transistor;

each second segment of the second data line is provided with seventh via holes at both ends in its extending direction of the second data line, and the seventh via holes penetrate the passivation layer; and the third electrically connecting part electrically connects each first segment of the second data line with the second segment adjacent with the first segment, through the sixth via holes and the seventh via holes.

According to this embodiment, the third electrically connecting part electrically connects each first segment of the second data line and the second segment adjacent with the first segment, through the adjacent sixth via holes and seventh via holes in the first segments and second segments of the second data line, so that a complete second data line is formed. The sixth via holes and seventh via holes can be formed in a same patterning process, which facilitates simplifying process steps. Alternatively, in case a planarization layer is further arranged over the passivation layer of the thin film transistor, the sixth via holes and seventh via holes accordingly further penetrate the planarization layer.

In an exemplary embodiment, the first data line comprises segments which are arranged alternately, at least some of the segments are arranged in a same layer as a gate of the thin film transistor; and a portion of the second data line which is arranged side by side with respect to the segments of the first data line is arranged in a same layer as the source and drain of the thin film transistor.

According to this embodiment, some segments of the first data line are formed when the gate and the gate lines are formed, and the corresponding portion of the second data line which are arranged side by side with respect to these segments is formed in a conventional manner. In this way, the first data line and the second data line are at least partially arranged in different layers, and this further prevents short circuit and cross-talk between dual data lines which are arranged side by side.

In an exemplary embodiment, adjacent segments of the first data line are electrically connected with each other through electrically connecting parts, and the electrically connecting parts comprise a first electrically connecting layer which consists of a conductive material for forming the pixel electrode. In an exemplary embodiment, the first electrically connecting part, the second electrically connecting part and the third electrically connecting part are arranged in a same layer as the pixel electrode of each sub-pixel unit.

According to this embodiment, the first, second, and third electrically connecting part are arranged in a same layer as the pixel electrode of each sub-pixel unit. In this manner, the first, second, and third electrically connecting part can be formed in a same patterning process, which facilitates controlling the number of patterning processes, and further controlling cost.

In an exemplary embodiment, the first electrically connecting layer is made from ITO (indium tin oxide).

According to this embodiment, the first electrically connecting layer of each electrically connecting part is made from the conductive material ITO for forming the pixel electrode. Therefore, the first electrically connecting layer of each electrically connecting part can be formed at the same time in the patterning process for forming the pixel electrode. In this manner, there is no addition to patterning processes in the existing fabricating process, thus leading no increase in cost.

In an exemplary embodiment, the first electrically connecting part, the second electrically connecting part and the third electrically connecting part can further comprise a second electrically connecting layer formed on the first electrically connecting layer, and the second electrically connecting layer comprises a metal.

According to this embodiment, the second electrically connecting layer comprising a metal can improve conductivity of the electrically connecting parts, which facilitates realizing electrical connection between adjacent segments of the first data line or second data line. In addition, a pattern of the first electrically connecting layer and second electrically connecting layer of the electrically connecting parts and a pattern of the pixel electrode can be formed in a single patterning process, and then the second electrically connecting layer on the pixel electrode is removed to form the pixel electrode. In this manner, there is no addition to patterning processes in the existing fabricating process, thus leading to no increase in cost.

In an exemplary embodiment, the second electrically connecting layer comprises a single metal layer or stacked metal layers.

According to this embodiment, the second electrically connecting layer is formed by a single metal layer or stacked layers with low electrical resistivity, thus improving conductivity between electrically connecting parts. In this manner, this facilitates realizing excellent electrical connection between adjacent segments of the first data line as well as adjacent segments of the second data line.

In an exemplary embodiment, the second electrically connecting layer is made from a Mo single layer or Mo/Al/Mo stacked layers.

According to this embodiment, in case the second electrically connecting layer is made from a single layer or stacked layers free from Al, a dry etching process can be used to remove the second electrically connecting layer over ITO in a region of the pixel electrode, so as to form the pixel electrode. In addition, according to this embodiment, in case the second electrically connecting layer is made from a single layer or stacked layers comprising Al, ITO can be annealed firstly, and then a wet etching process can be used to remove the second electrically connecting layer over ITO in the region of the pixel electrode, so as to form the pixel electrode.

In an exemplary embodiment, the electrically connecting parts at least partially overlap with the gate lines.

According to this embodiment, the electrically connecting parts overlap with the gate lines or are arranged across the gate lines, and via holes in both ends of each segment of the first data line and/or second data line are arranged close to the gate lines. In this manner, each segment of the first data line and/or second data line can be arranged between two neighboring gate lines, and adjacent segments can be electrically connected with each other by means of electrically connecting parts across the gate lines, so that a complete first data line and/or second data line is formed.

In a second aspect, the present disclosure provides a display panel, comprising the array substrate as described above.

In a third aspect, the present disclosure provides a display device, comprising the display panel as described above.

In a fourth aspect, the present disclosure provides a method for fabricating an array substrate, wherein the array substrate comprises gate lines and data lines on a substrate plate which are insulated from each other and intersect to define sub-pixel units, wherein a thin film transistor and a pixel electrode are formed in each of the sub-pixel units, the data lines comprise a first data line and a second data line which are arranged side by side between two neighboring columns of sub-pixel units, wherein in every two neighboring columns of sub-pixel units, sub-pixel units in odd rows are connected with the first data line, and sub-pixel units in even rows are connected with the second data line, wherein the method comprises steps of:

forming on a substrate plate a pattern comprising a gate and the gate lines of the thin film transistor and the second segments of the first data line, by a first patterning process;

forming a pattern comprising the source and drain of the thin film transistor and the second segments of the second data line by a second patterning process, wherein the second segments of the second data line and the second segments of the first data line are arranged side by side;

forming a pattern comprising via holes over the second segments of the first data line and the second segments of the second data line, by a third patterning process; and forming a pattern comprising electrically connecting parts by a fourth patterning process, wherein the electrically connecting parts electrically connect the second segments of the first data line to the adjacent first segments of the first data line.

The second segments of the first data line which are arranged in a same layer as the gate are formed in the first patterning process, and the second segments of the second data line which are arranged in a same layer as the source and drain are formed in the second patterning process. As a result, the second segments of the first data line and the second segments of the second data line are arranged in different layers. Namely, the first data line and the second data line are at least partially arranged in different layers.

Reference can be made to embodiments of the array substrate as described above for the specific technical effects.

In an exemplary embodiment, the method comprises:

forming a pattern comprising the gate and the gate lines of the thin film transistor, the second segments of the first data line and the first segments of the first data line, in the first patterning process; and forming a pattern comprising the source and drain of the thin film transistor and a continuous second data line, in the second patterning process.

In an exemplary embodiment, the method comprises:

forming a pattern comprising the first via holes, the second via holes, and the third via hole in the third patterning process, wherein the first via holes are arranged at both ends of each first segment of the first data line in its extending direction along the first data line and penetrate a gate insulating layer and a passivation layer of the thin film transistor, the second via holes are arranged at both ends of each second segment of the first data line in its extending direction along the first data line and penetrate the gate insulating layer and the passivation layer, and the third via hole is arranged over a source and drain of the thin film transistor and penetrates the passivation layer; and forming a pattern comprising the first electrically connecting part in the fourth patterning process, wherein the first electrically connecting part is electrically connected with the source and drain, each first segment of the first data line and the second segment adjacent with the first segment, through the first via holes, the second via holes and the third via hole.

In an exemplary embodiment, the method comprises:

forming a pattern comprising the source and drain of the thin film transistor, the second segments of the second data line and the first segments of first data line, in the second patterning process.

In an exemplary embodiment, the method comprises:

forming a pattern comprising the source and drain of the thin film transistor, the continuous second data line and the first segments of the first data line, in the second patterning process.

In an exemplary embodiment, the method comprises:

forming a pattern comprising fourth via holes and fifth via holes in the third patterning process, wherein the fourth via holes are arranged at both ends of each first segment of the first data line in its extending direction along the first data line and penetrate a passivation layer the thin film transistor, and the fifth via holes are arranged at both ends of each second segment of the first data line in its extending direction along the first data line and penetrate the gate insulating layer and the passivation layer; and forming a pattern comprising a second electrically connecting part in the fourth patterning process, wherein the second electrically connecting part is electrically connected with each first segment of the first data line and the second segment adjacent with the first segment, through the fourth via holes and the fifth via holes.

In an exemplary embodiment, the method comprises:

forming a pattern comprising the gate and the gate lines of the thin film transistor, the second segments of the first data line and the first segments of the second data line, in the first patterning process.

In an exemplary embodiment, the method comprises:

forming a pattern comprising sixth via holes and seventh via holes in the third patterning process, wherein the sixth via holes are arranged at both ends of each first segment of the second data line in its extending direction of the second data line and penetrate a gate insulating layer and a passivation layer of the thin film transistor, and the seventh via holes are arranged at both ends of each second segment of the second data line in its extending direction of the second data line and penetrate the passivation layer; and forming a pattern comprising a third electrically connecting part in the fourth patterning process, wherein the third electrically connecting part electrically connects each first segment of the second data line with the second segment adjacent with the first segment, through the sixth via holes and the seventh via holes.

In an exemplary embodiment, the method comprises:

forming a pattern comprising the electrically connecting parts and the pixel electrode of each sub-pixel unit, in the fourth patterning process.

In an exemplary embodiment, the step of forming the pattern comprising the electrically connecting parts and the pixel electrode of each sub-pixel unit comprises:

depositing a first electrically connecting layer on the substrate plate resulting from the third patterning process, wherein the first electrically connecting layer comprises a conductive material for forming the pixel electrode;

retaining photoresist in a region where the pixel electrode and the electrically connecting parts are to be formed and removing photoresist in the remaining region, by exposure;

removing the conductive material in the remaining region; and stripping photoresist in the region where the pixel electrode and the electrically connecting parts are to be formed, to form the electrically connecting parts and the pixel electrode.

In an exemplary embodiment, the step of forming the pattern comprising electrically connecting parts in the fourth patterning process comprises:

depositing in sequence a first electrically connecting layer and a second electrically connecting layer, on the substrate plate resulting from the third patterning process, wherein the first electrically connecting layer comprises a conductive material for forming the pixel electrode, and the second electrically connecting layer does not comprise Al;

retaining photoresist in a region where the electrically connecting parts are to be formed, partially removing photoresist in a region where the pixel electrode is to be formed, and completely removing photoresist in the remaining region, by exposure with a translucent mask plate;

removing the second electrically connecting layer in the remaining region by dry etching, and removing the first electrically connecting layer in the remaining region by further etching;

completely removing photoresist in the region where the pixel electrode is to be formed and thinning photoresist in the region where the electrically connecting parts are to be formed, by ashing;

removing the second electrically connecting layer in the region where the pixel electrode is to be formed by dry etching, so as to form the pixel electrode which consists of the first electrically connecting layer; and stripping photoresist in the region where the electrically connecting parts are to be formed, so as to form the electrically connecting parts which consist of the first electrically connecting layer and the second electrically connecting layer.

In an exemplary embodiment, the step of forming the pattern comprising electrically connecting parts in the fourth patterning process comprises:

depositing in sequence a first electrically connecting layer and a second electrically connecting layer, on the substrate plate resulting from the third patterning process, wherein the first electrically connecting layer comprises a conductive material for forming the pixel electrode, and the second electrically connecting layer comprises Al;

retaining photoresist in a region where the electrically connecting parts are to be formed, partially removing photoresist in a region where the pixel electrode is to be formed, and completely removing photoresist in the remaining region, by exposure with a translucent mask plate;

removing the second electrically connecting layer in the remaining region by dry etching, and removing the first electrically connecting layer in the remaining region by further etching;

completely removing photoresist in the region where the pixel electrode is to be formed and thinning photoresist in the region where the electrically connecting parts are to be formed, by ashing;

annealing the first electrically connecting layer;

removing the second electrically connecting layer in the region where the pixel electrode is to be formed by wet etching, thus forming the pixel electrode which consists of the first electrically connecting layer; and stripping photoresist in the region where the electrically connecting parts are to be formed, so as to form the electrically connecting parts which consist of the first electrically connecting layer and the second electrically connecting layer.

In an exemplary embodiment, the step of depositing the second electrically connecting layer comprises depositing a single metal layer or stacked metal layers.

The display panel, the display device, and the method for fabricating the array substrate of the present disclosure have the same or similar benifical effects of the array substrate as described above, which are not repeated herein for simplicity.

BRIEF DESCRIPTION OF THE DRAWINGS

FIG. 3a and FIG. 3b are schematic cross-sectional views illustrating an array substrate in an exemplary embodiment of the present disclosure, wherein FIG. 3a is a schematic cross-sectional view of the array substrate along a line A-B in FIG. 2, and FIG. 3b is a schematic cross-sectional view of the array substrate along a line C-D in FIG. 2;

FIG. 5a and FIG. 5b are schematic cross-sectional views illustrating an array substrate in an exemplary embodiment of the present disclosure, wherein FIG. 5a is a schematic cross-sectional view of the array substrate along a line A-B in FIG. 4, and FIG. 5b is a schematic cross-sectional view of the array substrate along a line C-D in FIG. 4;

FIG. 7a, FIG. 7b, FIG. 7c, and FIG. 7d are schematic cross-sectional views illustrating an array substrate in an exemplary embodiment of the present disclosure, wherein FIG. 7a is a schematic cross-sectional view of the array substrate along a line A-B in FIG. 6, FIG. 7b is a schematic cross-sectional view of the array substrate along a line G-H in FIG. 6, FIG. 7c is a schematic cross-sectional view of the array substrate along a line C-D in FIG. 6, and FIG. 7d is a schematic cross-sectional view of the array substrate along a line E-F in FIG. 6;

DETAILED DESCRIPTION OF EMBODIMENTS

Figure 1:
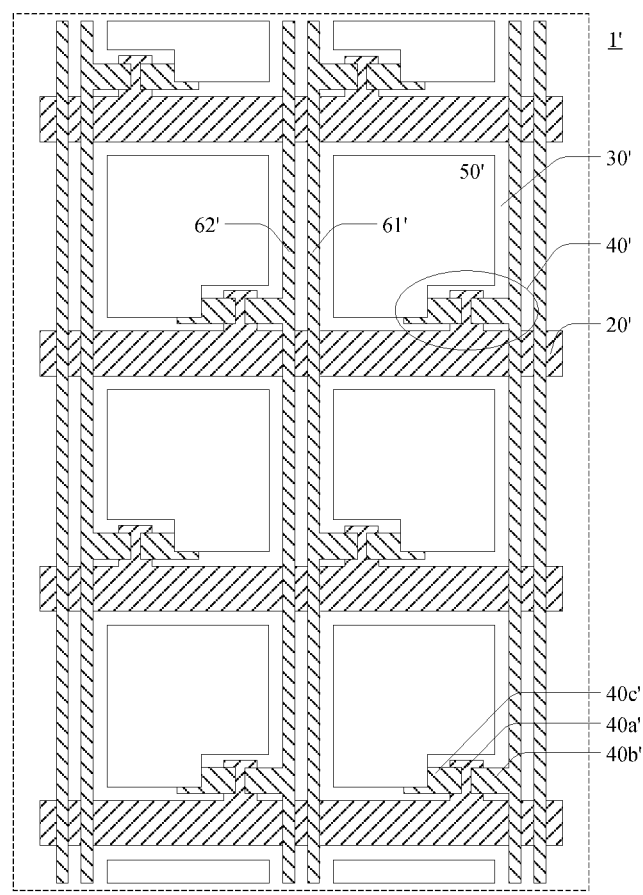
FIG. 1 is a schematic top view illustrating an array substrate in an existing display panel.

Embodiments of the array substrate, the display panel, the display device, and the method for fabricating the array substrate will be described hereinafter by referring to the accompanying drawings. These drawings schematically illustrate structures, portions and/or steps relevant with the inventive concept, and omit or partially illustrate structures, portions and/or steps irrelevant with the inventive concept.

Reference numerals: 1' array substrate; 20' gate line; 30' sub-pixel unit; 40' thin film transistor; 40a' gate; 40b' source; 40c' drain; 50' pixel electrode; 61' first data line; 62' second data line; 1, 2, 3 array substrate; 20 gate line; 30 sub-pixel unit; 40 thin film transistor; 40a gate; 40b source; 40c drain; 42 gate insulating layer; 44 passivation layer; 50 pixel electrode; 61 first data line; 62 second data line; 611, 613 first segments of first data line; 612, 614 second segments of first data line; 621 first segments of second data line; 622 second segments of second data line; 701 first via hole; 702 second via hole; 703 third via hole; 704 fourth via hole; 705 fifth via hole; 706 sixth via hole; 707 seventh via hole; 801 first electrically connecting part; 802 second electrically connecting part; 803 third electrically connecting part; 8021 first electrically connecting layer; 8022 second electrically connecting layer; 90, 92 photoresist; 91, 93 mask plate; 911, 931 transparent region, 912, 933 non-transparent region; 932 partially transparent region.

Figure 2:
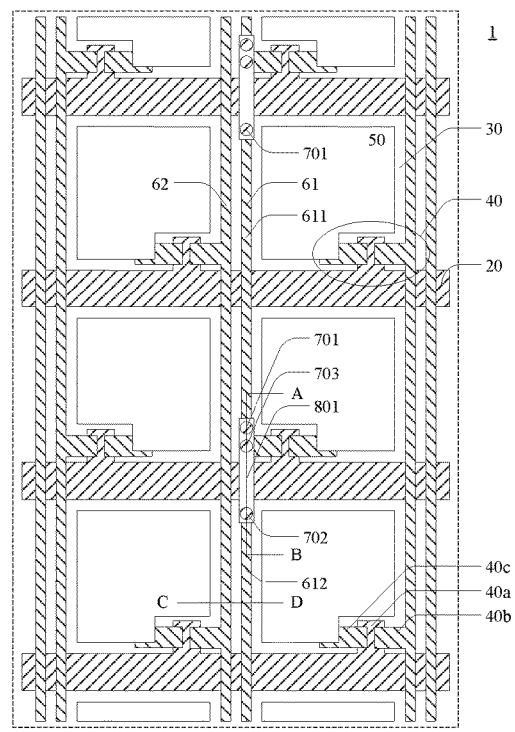
FIG. 2 is a schematic top view illustrating an array substrate in an exemplary embodiment of the present disclosure.

An array substrate 1 according to an embodiment of the present disclosure will be described hereinafter by referring to FIG. 2, FIG. 3a, and FIG. 3b. FIG. 2 is a schematic top view for the array substrate 1 in the present embodiment, FIG. 3a is a schematic cross-sectional view for the array substrate 1 along a line A-B of FIG. 2, and FIG. 3b is a schematic cross-sectional view for the array substrate 1 along a line C-D of FIG. 2.

In a display panel, the array substrate 1 comprises gate lines 20 and data lines on a substrate plate 10 which are insulated from each other and intersect to define sub-pixel units 30. In each of the sub-pixel units 30, a thin film transistor 40 and a pixel electrode 50 are formed. The thin film transistor 40 comprises a gate 40a, a source 40b, and a drain 40c. The data lines comprise a first data line 61 and a second data line 62 which are arranged side by side between every two neighboring columns of sub-pixel units 50. In every two neighboring columns of sub-pixel units 30, sub-pixel units 30 in odd rows are connected with the first data line 61, and sub-pixel units in even rows are connected with the second data line 62.

As shown in FIG. 2, the first data line 61 comprises first segments 611 and second segments 612 which are arranged alternately. Each of the first segments 611 is provided with first via holes 701 at both ends, and each the second segments 612 is provided with second via holes 702 at both ends. A first electrically connecting part 801 electrically connects each of the first segments 611 of the first data line 61 with an adjacent second segment 612 through the first via holes 701 and the second via holes 702. A third via hole 703 is further arranged above the source 40b of the thin film transistor 40. The first electrically connecting part 801 electrically connects both the first segments 611 and the second segments 612 of the first data line 61 to the source 40b of the thin film transistor 40 through the third via hole 703, thus forming a complete first data line 61. The second data line 62 is arranged in a same layer as the source 40b and drain 40c of the thin film transistor 40, and is electrically connected to the source 40b.

Figure 3A:
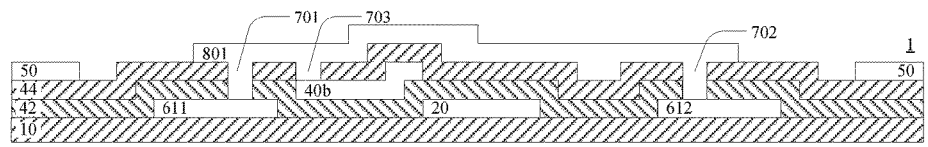
Figure 3B:
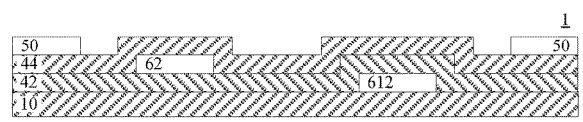

Reference is made to FIG. 3a and FIG. 3b, for describing the first data line 61 and the second data line 62 in details. FIG. 3a is a schematic cross-sectional view for the array substrate 1 along the line A-B in FIG. 2. The line A-B starts at a point A at the pixel electrode 50 of one of the sub-pixel units 30, extends through a portion of one of the first segments 611 of the first data line 61, the first electrically connecting part 801, and a portion of of one the second segments 612 of the first data line 61, and stops at a point B at the pixel electrode 50 of a neighboring sub-pixel unit 30 in the same column. FIG. 3b is a schematic cross-sectional view for the array substrate 1 along the line C-D in FIG. 2. The line C-D starts at a point C at the pixel electrode 50 of one of the sub-pixel units 30, extends through the second data line 62 and the second segments 612 of the first data line 61 in a direction perpendicular to the data line, and stops at a point D at the pixel electrode 50 of a neighboring sub-pixel unit 30 in the same row.

As shown in FIG. 3a, the first segments 611 and the second segments 612 of the first data line 61, the gate 40a (not shown in FIG. 3a), and the gate lines 20 are arranged on the substrate plate 10. Each of the first segments 611 of the first data line 61 is provided with the first via holes 701 at both ends, and the first via holes 701 penetrate a gate insulating layer 42 and a passivation layer 44 of the thin film transistor 40. The second segments 612 of the first data line 61 is provided with the second via holes 702 at both ends, and the second via holes 702 penetrate the gate insulating layer 42 and the passivation layer 44 of the thin film transistor 40. The third via hole 703 is arranged above the source 40b of the thin film transistor 40 and penetrates the passivation layer 44. The first electrically connecting part 801 is arranged on the passivation layer 44, and electrically connects each of the first segments 611, the adjacent second segment 612, and the source 40b through the first via holes 701, the second via holes 702, and the third via hole 703, thus forming the complete first data line 61.

As shown in FIG. 3b, the second segments 612 of the first data line 61 is arranged below the gate insulating layer 42 and is arranged in a same layer as the gate 40a (not shown in FIG. 3b), while the second data line 62 is arranged on the gate insulating layer 42 and is arranged in a same layer as the source 40b and the drain 40c (not shown in FIG. 3b). Therefore, the second segments 612 of the first data line 61 is arranged in a layer different from the second data line 62. In addition, as can be seen from FIG. 3a, each of the first segments 611 of the first data line 61 is also arranged in a layer different from the second data line 62.

Therefore, in the present embodiment, each of the first segments 611 and second segments 612 of the first data line 61 is arranged in a layer different from the second data line 62, so that the DDS problem can be effectively solved. Even in case of a relatively small distance between the first data line 61 and the second data line 62, the first data line and second data line designed as above can effectively solve the DDS problem, so that the yield of product will not be affected adversely.

As known in the art, a dielectric layer such as planarization layer (not shown) can further be arranged over the passivation layer 44 of the thin film transistor 40. In this case, the first via holes 701, the second via holes 702, and the third via hole 703 accordingly further penetrate the planarization layer.

Figure 4:
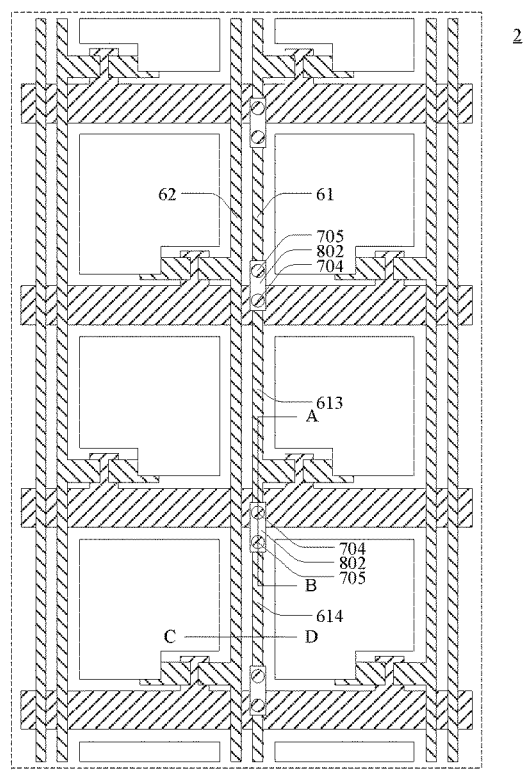
FIG. 4 is a schematic top view illustrating an array substrate in an exemplary embodiment of the present disclosure.

An array substrate 2 in an embodiment of the present disclosure will be described hereinafter by referring to FIG. 4, FIG. 5a, and FIG. 5b. FIG. 4 is a schematic top view for the array substrate 2 of the present embodiment, FIG. 5a is a schematic cross-sectional view for the array substrate 2 along a line A-B in FIG. 4, and FIG. 5b is a schematic cross-sectional view for the array substrate 2 along the line C-D in FIG. 4.

The present embodiment is different from the embodiment shown in FIGS. 2, 3a-3b in that, the first segments of the first data line are arranged in a same layer as the source and drain of the thin film transistor, instead of in a same layer as the gate of the thin film transistor in the embodiment shown in FIGS. 2, 3a-3b.

As shown in FIG. 4, the first data line 61 comprises first segments 613 and second segments 614 which are arranged alternately. Each of the first segments 613 is provided with fourth via holes 704 at both ends, and each of the second segments 614 is provided with fifth via holes 705 at both ends. A second electrically connecting part 802 electrically connects each of the first segments 613 of the first data line 61 with the adjacent second segment 614 through the fourth via holes 704 and the fifth via holes 705, thus forming the complete first data line 61. Since the first segments 613 are arranged in a same layer as the source 40b and drain 40c of the thin film transistor 40, the third via hole 703 in the previous embodiment shown in FIGS. 2, 3a-3b which is arranged above the source 40b can be omitted in this case. The second data line 62 is arranged in a same layer as the source 40b and drain 40c of the thin film transistor 40, and is electrically connected to the source 40b.

Figure 5A:
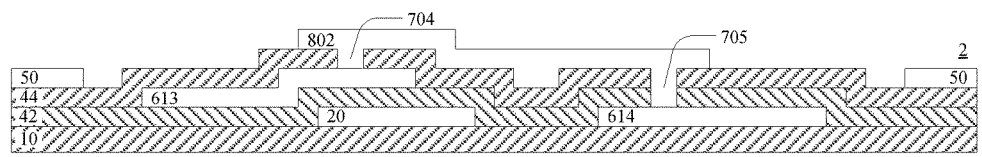
Figure 5B:
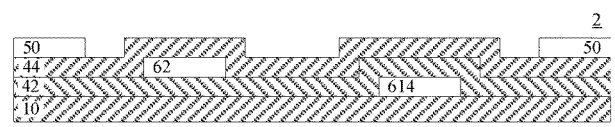

Reference is made to FIG. 5a and FIG. 5b for describing the first data line 61 and the second data line 62 in details.

As shown in FIG. 5a, the second segments 614 of the first data line 61, the gate 40a (not shown in FIG. 5a), and the gate lines 20 are arranged on the substrate plate 10. The first segments 613 of the first data line 61, and the source 40b and drain 40c of the thin film transistor 40 (not shown in FIG. 5a) are arranged on the gate insulating layer 42. Each of the first segments 613 of the first data line 61 is provided with the fourth via holes 704 at both ends, and the fourth via holes 704 penetrate the passivation layer 44 of the thin film transistor 40. The second segments 614 of the first data line 61 is provided with the fifth via holes 705 at both ends, and the fifth via holes 705 penetrate the gate insulating layer 42 and the passivation layer 44 of the thin film transistor 40. The second electrically connecting part 802 is arranged on the passivation layer 44, and electrically connects each of the first segments 613 with the adjacent second segment 614 through the fourth via holes 704 and the fifth via holes 705, thus forming the complete first data line 61.

As shown in FIG. 5b, the second segments 614 of the first data line 61 is arranged below the gate insulating layer 42 and is arranged in a same layer as the gate 40a (not shown in FIG. 5b), while the second data line 62 is arranged on the gate insulating layer 42 and is arranged in a same layer as the source 40b and the drain 40c (not shown in FIG. 5b). Therefore, the second segments 614 of the first data line 61 is arranged in a layer different from the second data line 62.

Therefore, in the present embodiment, the second segments 614 of the first data line 61 is arranged in a layer different from the second data line 62, so that the DDS problem can be effectively solved.

Figure 6:
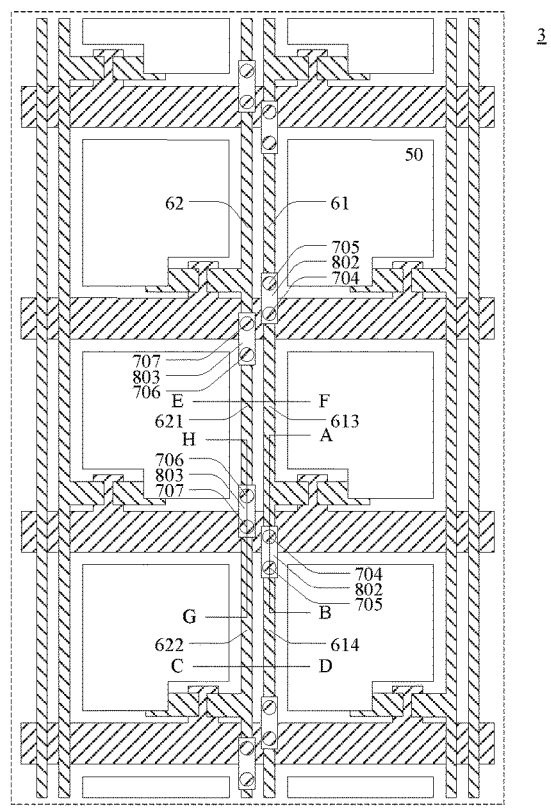
FIG. 6 is a schematic top view illustrating an array substrate in an exemplary embodiment of the present disclosure.
Figure 7A:
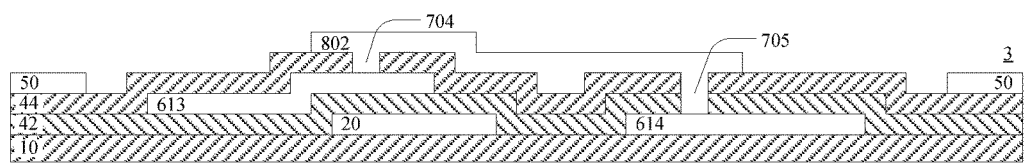
Figure 7B:
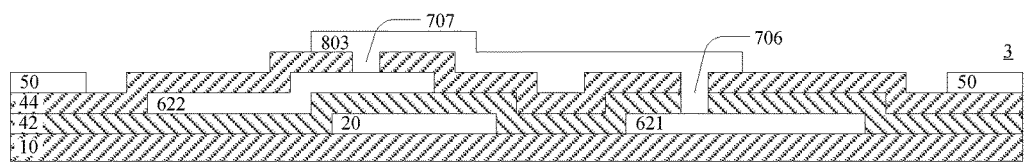
Figure 7C:
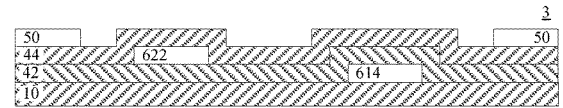
Figure 7D:
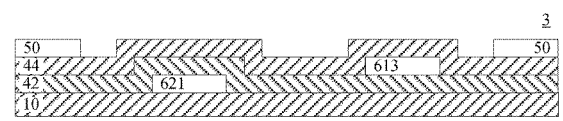

An array substrate 3 in an embodiment of the present disclosure will be described hereinafter by referring to FIG. 6, FIG. 7a, FIG. 7b, FIG. 7c, and FIG. 7d. FIG. 6 is a schematic top view for the array substrate 3 of the present embodiment, FIG. 7a is a schematic cross-sectional view for the array substrate 3 along the line A-B in FIG. 6, FIG. 7b is a schematic cross-sectional view for the array substrate 3 along a line G-H in FIG. 6, FIG. 7c is a schematic cross-sectional view for the array substrate 3 along the line C-D in FIG. 6, and FIG. 7d is a schematic cross-sectional view for the array substrate 3 along a line E-F in FIG. 6.

The present embodiment is different from the embodiment shown in FIGS. 4, 5a-5b in that the second data line comprises segments which are arranged in a staggered manner, and each of which is arranged in a different layer from the respective segment of the first data line.

As shown in FIG. 6, the first data line 61 comprises first segments 613 and second segments 614 which are arranged alternately. Each of the first segments 613 is provided with the fourth via holes 704 at both ends, and each of the second segments 614 is provided with the fifth via holes 705 at both ends. The second electrically connecting part 802 electrically connect each of the first segments 613 of the first data line 61 with the adjacent second segment 614 through the fourth via holes 704 and the fifth via holes 705, thus forming the complete first data line 61.

As shown in FIG. 6, the second data line 62 comprises first segments 621 and second segments 622 which are arranged alternately. Each of the first segments 621 is provided with sixth via holes 706 at both ends, and each of the second segments 622 is provided with seventh via holes 707 at both ends. A third electrically connecting part 803 electrically connects each of the first segments 621 of the second data line 62 with the adjacent second segment 622 through the sixth via holes 706 and the seventh via holes 707, thus forming a complete second data line 62.

Reference is made to FIG. 7a, FIG. 7b, FIG. 7c and FIG. 7d, for describing the first data line 61 and the second data line 62 in details.

As shown in FIG. 7a, the second segments 614 of the first data line 61, the gate 40a (not shown in FIG. 7a) and gate lines 20 arranged on the substrate plate 10. The first segments 613 of the first data line 61 and the source 40b and drain 40c of the thin film transistor 40 (not shown in FIG. 7a) are arranged on the gate insulating layer 42. The fourth via holes 704 penetrate the passivation layer 44, and the fifth via holes 705 penetrate the gate insulating layer 42 and the passivation layer 44. The second electrically connecting part 802 is arranged on the passivation layer 44, and each of the first segments 613 is electrically connected with the adjacent second segment 614 through the fourth via holes 704 and the fifth via holes 705, thus forming the complete first data line 61.

FIG. 7b is a schematic cross-sectional view for the array substrate 3 along the line G-H in FIG. 6. The line G-H starts at a point G at the pixel electrode 50 of one of the sub-pixel units 30, extends through a portion of one of the second segments 622 of the second data line 62, the third electrically connecting part 803, and a portion of one of the first segments 621 of the second data line 62, and stops at a point H at the pixel electrode 50 of a neighboring sub-pixel unit 30 in the same row. As shown in FIG. 7b, the first segments 621 of the second data line 62, the gate 40a (not shown in FIG. 7b) and gate lines 20 are arranged on the substrate plate 10. The second segments 622 of the second data line 62 and the source 40b and drain 40c of the thin film transistor 40 (not shown in FIG. 7b) are arranged on the gate insulating layer 42. The seventh via holes 707 penetrate the passivation layer 44, and the sixth via holes 706 penetrate the gate insulating layer 42 and the passivation layer 44. The third electrically connecting part 803 is arranged on the passivation layer 44, and electrically connects each of the first segments 621 with the adjacent second segment 622 through the sixth via holes 706 and the seventh via holes 707, thus forming the complete second data line 62.

As shown in FIG. 7c, the second segments 614 of the first data line 61 are arranged below the gate insulating layer 42 and are arranged in a same layer as the gate 40a (not shown in FIG. 7c), while the second segments 622 of the second data line 62 are arranged on the gate insulating layer 42 and are arranged in a same layer as the source 40b and the drain 40c (not shown in FIG. 7c). Therefore, the second segments 614 of the first data line 61 are arranged in a different layer from the second segments 622 of the second data line 62.

FIG. 7d is a schematic cross-sectional view for the array substrate 3 along the line E-F in FIG. 6. The line E-F starts at a point E at the pixel electrode 50 of one of the sub-pixel units 30, extends through the first segments 612 of the second data line 62 and the first segments 613 of the first data line 61 in a direction perpendicular to the data lines, and stops at a point F at the pixel electrode 50 of a neighboring sub-pixel unit 30 in the same column. As shown in FIG. 7d, the first segments 621 of the second data line 62 are arranged below the gate insulating layer 42 and are arranged in a same layer as the gate 40a (not shown in FIG. 7d), while the first segments 613 of the first data line 61 are arranged on the gate insulating layer 42 and are arranged in a same layer as the source 40b and the drain 40c (not shown in FIG. 7d). Therefore, the first segments 613 of the first data line 61 are arranged in a different layer from the first segments 621 of the second data line 62.

Therefore, in the present embodiment, the first segments 613 of the first data line 61 are arranged in a different layer from the first segments 621 of the second data line 62, and the second segments 614 of the first data line 61 are arranged in a different layer from the second segments 622 of the second data line 62. Namely, any segment of the first data line 61 is arranged in a layer different from a corresponding segment of the second data line 62 which is arranged side by side with respect to the segment of the first data line 61, so that the DDS problem can be effectively solved. Even in case of a relatively small distance between the first data line 61 and the second data line 62, the first data line and the second data line designed as above can effectively solve the DDS problem, so that the yield of product will not be affected adversely.

A method for fabricating an array substrate according to an embodiment the present disclosure will be described hereinafter by referring to FIG. 8a, FIG. 8b, FIG. 8c, and FIG. 8d. FIGS. 8a-8d are schematic cross-sectional views for illustrating each step for fabricating an array substrate according to the present embodiment.

In particular, the method for fabricating an array substrate in the present disclosure will be described by taking the array substrate 3 shown in FIGS. 6, 7a-7d as an example. It is noted that each of the cross-sectional views in FIGS. 8a-8d corresponds to the structure along the line A-B in FIG. 6. Namely, FIGS. 8a-8d only illustrate each step for fabricating the first data line 61.

Firstly, a pattern comprising the gate 40a and the gate lines 20 of the thin film transistor 40, the second segments 614 of the first data line 61 (FIG. 8a) and the first segments 621 of the second data line 62 (FIG. 7d) is formed on the substrate plate 10 by a first patterning process.

Then, the gate insulating layer 42 is deposited on the resulting substrate plate 10 from the previous step, and a pattern comprising the source 40b and drain 40c of the thin film transistor 40, the first segments 613 of the first data line 61 (FIG. 8b), and the second segments 622 of the second data line 62 (FIG. 7c) is formed by a second patterning process.

Then, the passivation layer 44 is deposited on the resulting substrate plate 10 from the previous step, and a pattern comprising the fourth via holes 704 and the fifth via holes 705 (FIG. 8c and FIG. 7a) as well as the sixth via holes 706 and the seventh via holes 707 (FIG. 7b) is formed by a third patterning process. The fourth via holes 704 are arranged at both ends of each of the first segments 613 of the first data line 61, and penetrate the passivation layer 44 to expose a portion of each of the first segments 613. The fifth via holes 705 are arranged at both ends of each of the second segments 614 of the first data line 61, and penetrate the gate insulating layer 42 and the passivation layer 44 to expose a portion of each of the second segments 614. The sixth via holes 706 are arranged at both ends of each of the first segments 621 of the second data line 62, and penetrate the gate insulating layer 42 and the passivation layer 44 to expose a portion of each of the first segments 621. The seventh via holes 707 are arranged at both ends of each of the second segments 622 of the second data line 62, and penetrate the passivation layer 44 to expose a portion of each of the second segments 622.

Finally, a pattern comprising the second electrically connecting part 802 (FIG. 8d) and third electrically connecting part 803 (FIG. 7b) is formed on the resulting substrate plate 10 from the previous step by a fourth patterning process. The second electrically connecting part 802 electrically connects each of the first segments 613 of the first data line 61 with the adjacent second segment 614 through the fourth via holes 704 and the fifth via holes 705, thus forming the complete first data line 61. The third electrically connecting part 803 electrically connects each of the first segments 621 of the second data line 62 with the adjacent second segment 622 through the sixth via holes 706 and the seventh via holes 707, thus forming the complete second data line 62.

Through the above steps, the fabrication of the first data line 61 and the second data line 62 is complete, and the array substrate 3 shown in FIGS. 6, 7a-7d is obtained.

Figure 8A:
FIG. 8a, FIG. 8b, FIG. 8c and FIG. 8d are schematic cross-sectional views illustrating each step for fabricating an array substrate in an exemplary embodiment of the present disclosure.
Figure 8B:
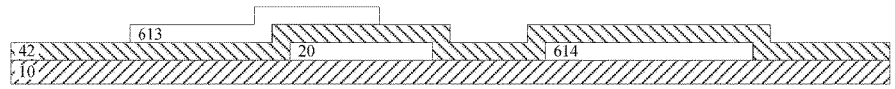
Figure 8C:
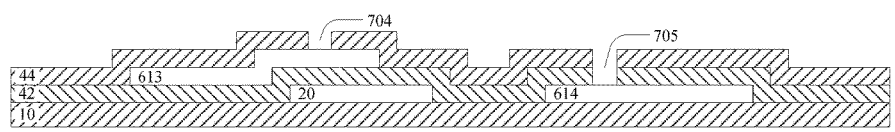
Figure 8D:
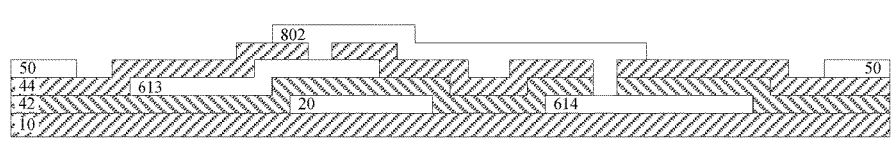

In an implementation, as shown in FIG. 8d, in the fourth patterning process, during forming the second electrically connecting part 802 and the third electrically connecting part 803, a pattern of the pixel electrode 50 in each of the sub-pixel units 30 is formed at the same time.

A method for fabricating the array substrate 1 shown in FIG. 2, FIGS. 3a-3b will be described hereinafter.

Firstly, a pattern comprising the gate 40a and the gate lines 20 of the thin film transistor 40, the first segments 611 of the first data line 61, and the second segments 612 of the first data line 61 is formed on the substrate plate 10 by a first patterning process (FIG. 3a).

Then, the gate insulating layer 42 is deposited on the resulting substrate plate 10 from the previous step, and a pattern comprising the source 40b and drain 40c of the thin film transistor 40 and the second data line 62 is formed by a second patterning process (FIG. 3b).

Then, the passivation layer 44 is deposited on the resulting substrate plate 10 from the previous step, and a pattern comprising the first via holes 701, the second via holes 703, and the third via hole 703 is formed by a third patterning process (FIG. 3a). The first via holes 701 are arranged at both ends of each of the first segments 611 of the first data line 61, and penetrate the gate insulating layer 42 and the passivation layer 44 to expose a portion of each of the first segments 611. The second via holes 702 are arranged at both ends of the second segments 612 of the first data line 61, and penetrate the gate insulating layer 42 and the passivation layer 44 to expose a portion of each of the first segments 612. The third via hole 703 is arranged above the source 40b of the thin film transistor 40, and penetrates the passivation layer 44 to expose a portion of the source 40b.

Finally, a pattern comprising the first electrically connecting part 801 is formed on the resulting substrate plate 10 from the previous step by a fourth patterning process (FIG. 3a). The first electrically connecting part 801 electrically connects each of the first segments 611, the adjacent second segment 612, and the source 40b through the first via holes 701, the second via holes 702, and the third via hole 703, thus forming the complete first data line 61.

Through the above steps, the fabrication of the first data line 61 and the second data line 62 is complete, and the array substrate 1 shown in FIGS. 2, 3a-3b is obtained.

A method for fabricating the array substrate 2 shown in FIG. 4, FIG. 5a-5b will be described hereinafter.

Firstly, a pattern comprising the gate 40a and the gate lines 20 of the thin film transistor 40 and the second segments 614 of the first data line 61 is formed on the substrate plate 10 by a first patterning process (FIG. 5a).

Then, the gate insulating layer 42 is deposited on the resulting substrate plate 10 from the previous step, and a pattern comprising the source 40b and drain 40c of the thin film transistor 40, the first segments 613 of the first data line 61, and the second data line 62 is formed by a second patterning process (FIG. 5b).

Then, the passivation layer 44 is deposited on the resulting substrate plate 10 from the previous step, and a pattern comprising the fourth via holes 704 and the fifth via holes 705 is formed by a third patterning process (FIG. 5a). The fourth via holes 704 are arranged at both ends of the first segments 613 of the first data line 61, and penetrate the passivation layer 44 to expose a portion of each of the first segments 613. The fifth via holes 705 are arranged at both ends of the second segments 614 of the first data line 61, and penetrate the gate insulating layer 42 and the passivation layer 44 to expose a portion of each of the first segments 614.

Finally, a pattern comprising the second electrically connecting part 802 is formed on the resulting substrate plate 10 from the previous step by a fourth patterning process (FIG. 5a). The second electrically connecting part 802 electrically connects the first segments 613 of the first data line 61 with the adjacent second segment 614 through the fourth via holes 704 and the fifth via holes 705, thus forming the complete first data line 61.

Through the above steps, the fabrication of the first data line 61 and the second data line 62 is complete, and the array substrate 2 shown in FIGS. 4, 5a-5b is obtained.

A method for fabricating an array substrate according to an embodiment of the present disclosure will be described hereinafter by referring to FIGS. 9a-9e. FIGS. 9a-9e are schematic cross-sectional views illustrating each step for fabricating an array substrate according to the present embodiment.

In particular, the fourth patterning process shown in FIG. 8d will be described in the present embodiment in details. In the fourth patterning process, a pattern comprising the electrically connecting parts and the pixel electrode of each of the sub-pixel units is formed, and the electrically connecting parts and the pixel electrode are made from a same material. For example, steps for forming the second electrically connecting part 802 and the pixel electrode 50 in the fourth patterning process will be described by taking the embodiment shown in FIG. 6 and FIG. 7a as an example.

Figure 9A:
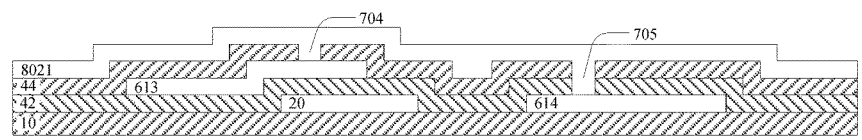
FIG. 9a, FIG. 9b, FIG. 9c, FIG. 9d, and FIG. 9e are schematic cross-sectional views illustrating each step for fabricating an array substrate in an exemplary embodiment of the present disclosure.

Firstly, as shown in FIG. 9a, a first electrically connecting layer 8021 is deposited on the resulting substrate plate 10 from the third patterning process shown in FIG. 8c. The first electrically connecting layer 8021 can be made from a conductive material from which the pixel electrode 50 is made. For example, the conductive material can be ITO. The conductive material can further be other transparent conductive oxides such as IZO (indium zinc oxide), IGZO (indium gallium zinc oxide), and InGaSnO (indium gallium tin oxide). Of course, the pixel electrode 50 can also be made from other conductive materials.

Figure 9B:
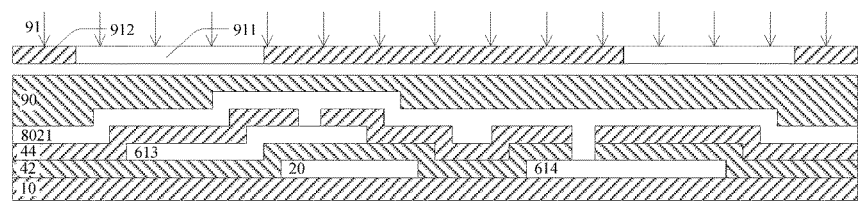
Figure 9C:
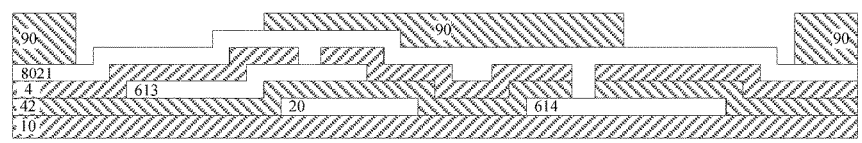

Then, as shown in FIG. 9b, photoresist 90 is applied on the substrate plate 10. An exposure process is conducted with a mask plate 91. The mask plate 91 comprises a transparent region 911 and a non-transparent region 912. The non-transparent region 912 corresponds to a region on the substrate plate 10 where the pixel electrode 50 and the second electrically connecting part 802 are to be formed, while the transparent region 911 corresponds to a remaining region on the substrate plate 10. After exposure, the photoresist 90 in the region where the pixel electrode 50 and the second electrically connecting part 802 are to be formed is retained, and the photoresist 90 in the remaining region is removed to expose the first electrically connecting layer 8021, as shown in FIG. 9c.

Figure 9D:
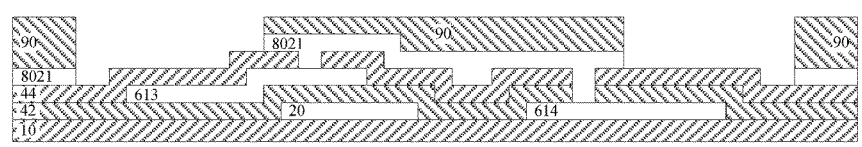

Then, as shown in FIG. 9d, the first electrically connecting layer 8021 is removed by etching in the remaining region.

Figure 9E:
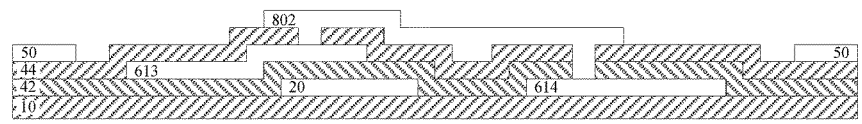

Finally, as shown in FIG. 9e, the photoresist 90 in the region where the pixel electrode 50 and the second electrically connecting part 802 are to be formed is stripped, thus forming the second electrically connecting part 802 and the pixel electrode 50.

Through the above steps, the second electrically connecting part 802 and the pixel electrode 50 which is formed from the first electrically connecting layer 8021 are formed. The first electrically connecting layer 8021 is made from ITO.

According to the present embodiment, in the patterning process for forming the pixel electrode 50, the second electrically connecting part 802 is formed at the same. In this manner, no patterning process is added in the existing fabricating process, and thus the cost is not increased.

A method for fabricating an array substrate according to an embodiment of the present disclosure will be described hereinafter by referring to FIG. 10a, FIG. 10b, FIG. 10c, FIG. 10d, FIG. 10e, FIG. 10f, and FIG. 10g. FIGS. 10a-10g are schematic cross-sectional views illustrating each step for fabricating an array substrate according to the present embodiment.

The present embodiment differs from the embodiment shown in FIGS. 9a-9e in that, apart from a same material as the pixel electrode, the electrically connecting parts further comprise a metal layer. Namely, the electrically connecting parts comprise stacked layers of a first electrically connecting layer and a second electrically connecting layer, wherein the first electrically connecting layer is ITO, and the second electrically connecting layer is a metal. Steps for forming the second electrically connecting part 802 and the pixel electrode 50 in the fourth patterning process will be described, by still taking the embodiment shown in FIG. 6 and FIG. 7a as an example.

Figure 10A:
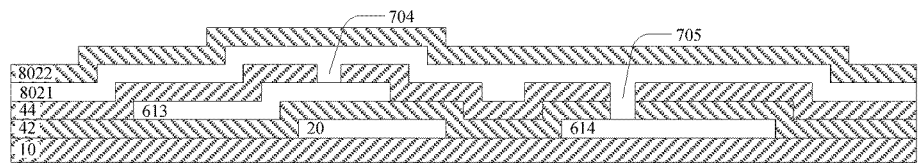
FIG. 10a, FIG. 10b, FIG. 10c, FIG. 10d, FIG. 10e, FIG. 10f, and FIG. 10g are schematic cross-sectional views illustrating each step for fabricating an array substrate in an exemplary embodiment of the present disclosure.

Firstly, as shown in FIG. 10a, the first electrically connecting layer 8021 and second electrically connecting layer 8022 are deposited in sequence on the resulting substrate plate 10 from the third patterning process shown in FIG. 8c. The first electrically connecting layer 8021 can be made from a conductive material from which the pixel electrode 50 is formed. For example, the conductive material can be ITO. The second electrically connecting layer 8022 can comprise a metal.

Figure 10B:
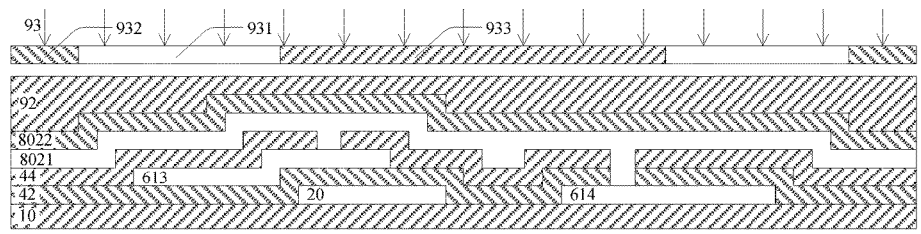

As shown in FIG. 10b, photoresist 92 is applied on the substrate plate 10. An exposure process is conducted with a mask plate 93. The mask plate 93 is a translucent mask plate, for example a half-tone mask plate and a gray-tone mask plate. The mask plate 93 comprises a transparent region 931, a partially transparent region 932, and a non-transparent region 933. The non-transparent region 933 corresponds to a region on the substrate plate 10 where the second electrically connecting part 802 is to be formed, the partially transparent region 932 corresponds to a region on the substrate plate 10 where the pixel electrode 50 is to be formed, while the transparent region 931 corresponds to a remaining region on the substrate plate 10.

Figure 10C:
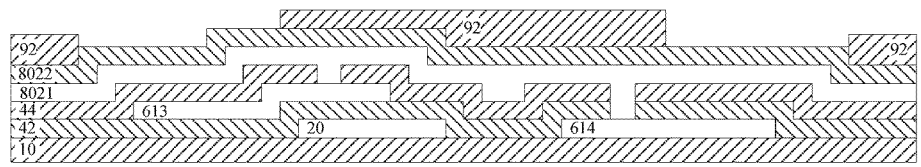

As shown in FIG. 10c, after exposure, the photoresist 92 in the region where the second electrically connecting part 802 is to be formed is completely retained, the photoresist 92 in the region where the pixel electrode 50 is to be formed is partially retained, and the photoresist 92 in the remaining region is completely removed. In the remaining region, since the photoresist 92 is removed, the second electrically connecting layer 8022 is exposed.

Figure 10D:
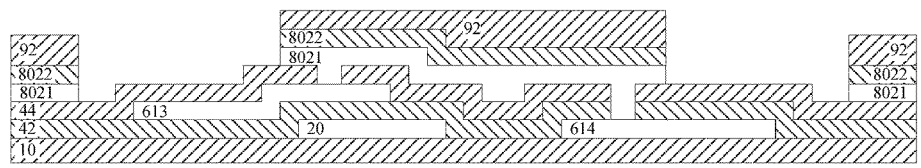

As shown in FIG. 10d, in the remaining region, the second electrically connecting layer 8022 is removed by dry etching to expose the first electrically connecting layer 8021, and the first electrically connecting layer 8021 is removed by etching.

Figure 10E:
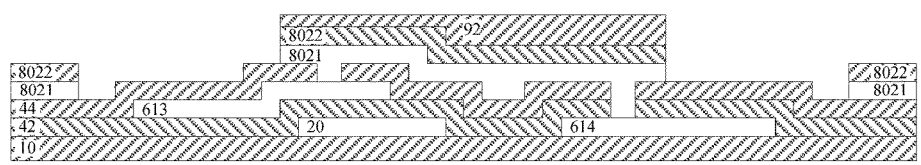

As shown in FIG. 10e, the photoresist 92 in the region where the pixel electrode 50 is to be formed is removed by ashing, thus exposing the second electrically connecting layer 8022. During ashing, the photoresist 92 in the region where the second electrically connecting part 802 is to be formed is thinned.

Figure 10F:
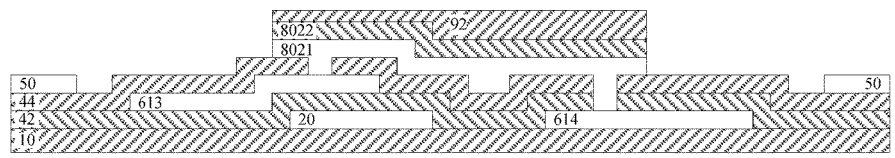

As shown in FIG. 10f, in the region where the pixel electrode 50 is to be formed, the second electrically connecting layer 8022 is removed by dry etching, and the first electrically connecting layer 8021 is retained to form the pixel electrode 50.

Figure 10G:
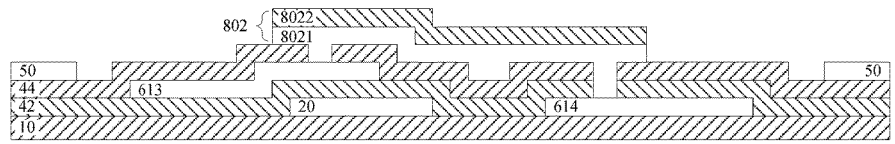

Finally, as shown in FIG. 10g, the photoresist 92 in the region where the second electrically connecting part 802 is to be formed is stripped, and the second electrically connecting part 802 consisting of the first electrically connecting layer 8021 and the second electrically connecting layer 8022 is formed.

Through the above steps, the pixel electrode 50 consisting of the first electrically connecting layer 8021 is formed, and the second electrically connecting part 802 consisting of the first electrically connecting layer 8021 and the second electrically connecting layer 8022 is formed. The first electrically connecting layer 8021 can be made from ITO. the second electrically connecting layer 8022 can be made from a metal, for example Mo, Cu, Mg, Ca, Cr, W, Ti, Ta, or the like.

In the present embodiment, since the second electrically connecting part 802 is formed by stacked layers of the first electrically connecting layer 8021 and the second electrically connecting layer 8022, a translucent mask plate such as the half-tone mask plate and the gray-tone mask plate is adopted in the exposure step.

In a step corresponding to the cross-sectional view of FIG. 10*f*, the second electrically connecting layer 8022 in the region where the pixel electrode 50 is to be formed is removed dry etching. Therefore, the method of this embodiment is particularly applicable to a case in which the second electrically connecting layer 8022 of the second electrically connecting part 802 does not comprise Al.

Figure 11A:
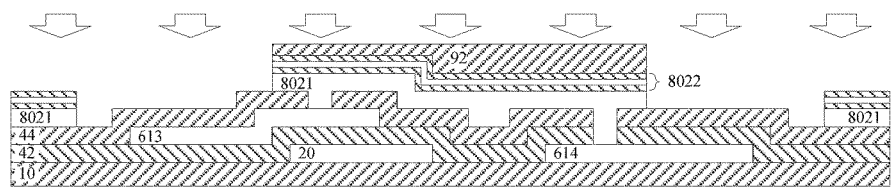
FIG. 11a, FIG. 11b, and FIG. 11c are schematic cross-sectional views illustrating each step for fabricating an array substrate in an exemplary embodiment of the present disclosure.
Figure 11B:
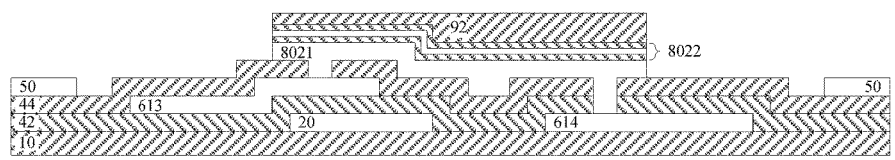
Figure 11C:
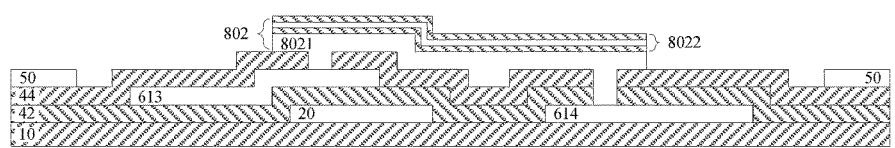

A method for fabricating an array substrate according to an embodiment of the present disclosure will be described hereinafter by referring to FIG. 11*a*, FIG. 11*b*, and FIG. 11*c*. FIGS. 11*a*-11*c* are schematic cross-sectional views for illustrating each step for fabricating an array substrate according to the present embodiment.

The present embodiment differs from the embodiment shown in FIGS. 10*a*-10*g* in that, the second electrically connecting layer 8022 of the second electrically connecting part 802 comprises Al. Steps for forming the second electrically connecting part 802 and the pixel electrode 50 in the fourth patterning process will be described, by still taking the embodiment shown in FIG. 6 and FIG. 7*a* as an example.

In the present embodiment, since the second electrically connecting layer 8022 comprises metal Al, the second electrically connecting layer 8022 in the region where the pixel electrode 50 is to be formed is for example removed by wet etching in the step corresponding to the cross-sectional view of FIG. 10*f*. Namely, the present embodiment differs from the embodiment shown in FIGS. 10*a*-10*g* in the step of removing the second electrically connecting layer 8022 which comprises Al in the region where the pixel electrode 50 is to be formed.

As shown by open arrows in FIG. 11*a*, the first electrically connecting layer 8021 on the substrate plate 10 shown in FIG. 10*e* is annealed, to improve crystalline quality of the conductive material e.g., of ITO, thus improving its etching resistance.

As shown in FIG. 11*b*, the second electrically connecting layer 8022 in the region where the pixel electrode 50 is to be formed is removed by wet etching. During the wet etching, since the first electrically connecting layer 8021 is subject to annealing treatment in advance, ITO in the first electrically connecting layer 8021 is resistant to etching of a solution for the wet etching. This facilitates ensuring performance of the pixel electrode 50 to be formed.

Finally, as shown in FIG. 11*c*, the photoresist 92 in the region where the second electrically connecting part 802 is to be formed is stripped, thus forming the second electrically connecting part 802 consisting of the first electrically connecting layer 8021 and the second electrically connecting layer 8022.

Through the above steps, the pixel electrode 50 made from the first electrically connecting layer 8021 is formed, and the second electrically connecting part 802 made from the first electrically connecting layer 8021 and the second electrically connecting layer 8022 is formed. The first electrically connecting layer 8021 can be made from ITO. the second electrically connecting layer 8022 comprises Al.

Alternatively, in case the second electrically connecting layer 8022 comprises Al, it is possible not to anneal the first electrically connecting layer 8021 in advance, but to select an appropriate etching solution and etching time, so as to reduce adverse effect of the etching solution on ITO in the first electrically connecting layer 8021 as much as possible.

As shown in FIGS. 11*a*-11*c*, the second electrically connecting layer 8022 for example comprises stacked metal layers. Namely, the second electrically connecting layer 8022 can comprise a single metal layer or stacked metal layers of low electrical resistivity, thus improving conductivity of the second electrically connecting part 802. In this manner, excellent electrically connection between the first segments 613 and the second segments 614 of the first data line 61 is facilitated. For example, the second electrically connecting layer 8022 can comprise a single Mo layer, or comprise stacked Mo/Al/Mo layers. Alternatively, the second electrically connecting layer can comprise two, four, or more metal layers.

In the above embodiments described with reference to FIGS. 9*a*-9*e*, FIGS. 10*a*-10*g*, and FIGS. 11*a*-11*c*, the electrically connecting parts in the present disclosure have been described by taking the second electrically connecting part 802 as an example. It is noted that the above description also applies to the first electrically connecting part 801 and the third electrically connecting part 803.

Based on the same inventive concept, an embodiment of the present disclosure provides a display panel. The display panel comprises the array substrate as described in the above embodiments of the present disclosure. The display panel further comprises other essential parts, which are known for a person with ordinary skill in the art, so that they are not described herein for simplicity and are not considered as limitations to the present disclosure.

The present embodiment further provides a display device. The display device comprises the display panel as described above. The display device can be any product or component with display function, for example a mobile phone, a tablet computer, a TV set, a monitor, a notebook computer, a digital photo frame, and a navigator.

According to the present disclosure, at least a part of the first data line is arranged in a layer different from that of the neighboring second data line. In this manner, DDS can be effectively prevented, thus improving the yield of product. Cross-talk between dual data lines which are arranged side by side can be significantly eliminated, thus improving the display quality of product. In addition, a small distance between dual data lines can be realized, thus improving the aperture ratio and wiring density of the array substrate. For example, some segments of the first data line are arranged in a same layer as the gate of the thin film transistor, and the corresponding portions of the second data line which are arranged side by side with respect to these segments are arranged in a same layer as the source and drain of the thin film transistor. As a result, these segments of the first data line and the corresponding portions of the second data line are arranged in different layers, so that the first data line and the second data line are at least partially arranged in different layers, thus preventing short circuit and cross-talk between dual data lines which are arranged side by side. According to technical solutions of the present disclosure, there is no addition to patterning processes in the existing fabricating process, thus leading no increase in cost.

The foregoing descriptions of embodiments of the present disclosure have been presented only for purposes of illustration and description. They are not intended to be exhaustive or to limit this disclosure. Accordingly, many modifications and variations will be apparent to the person with ordinary skill in the art. For example, in the above embodiments, a portion of the second data line is arranged in a same layer as the source and drain, and a corresponding portion of the first data line which is arranged side by side with respect to the portion of the second data line is arranged in a same layer as the gate, so that the first data line is at least partially arranged in a different layer from the second data line, thus alleviating or eliminating DDS. However, the present disclosure does not intend to restrict a layer in which the portion of the first data line lies and a different layer in which the portion of the second data line lies. For example, apart from the layer in which the source and the drain lie and the layer in which the gate lies as described above, The corresponding portion of the first data line can also be arranged in other conductive layers in the array substrate. These conductive layers can not only be existing conductive layers in the array substrate, but also additional conductive layers which are added intentionally. In addition, in the above embodiments, via holes in each segment of the data lines are arranged close to the gate lines of the thin film transistor, and the electrically connecting parts are arranged across the gate lines to electrically connect neighboring segments with each other, so as to form a complete first data line and/or second data line. However, the present disclosure does not intend to restrict positions of the electrically connecting parts and positions of via holes in each segment. For example, segments of the first data line and/or second data line can be arranged across the gate lines and the electrically connecting parts can be arranged between two neighboring gate lines, provided that the segments are electrically connected with each other by the electrically connecting parts to form a complete data line. In short, the scope of the present disclosure is defined by the appended claims.

What is claimed is:

1. An array substrate, comprising gate lines and data lines on a substrate plate which are insulated from each other and intersect to define sub-pixel units, wherein a thin film transistor and a pixel electrode are formed in each of the sub-pixel units, the data lines comprise a first data line and a second data line which are arranged side by side between two neighboring columns of sub-pixel units, wherein in every two neighboring columns of sub-pixel units, sub-pixel units in odd rows are connected with the first data line, and sub-pixel units in even rows are connected with the second data line, wherein between two of the sub-pixel units which are neighbors in a column direction, at least a portion of the first data line is arranged in a layer different from the neighboring second data line, wherein the first data line comprises first segments and second segments which are arranged alternately in an extending direction of the first data line, the first segments are arranged in a same layer as a source and drain of the thin film transistor, the second segments are arranged in a same layer as a gate of the thin film transistor, and each first segment is electrically connected with an adjacent second segment through a second electrically connecting part.

2. The array substrate of claim 1, wherein, the second data line is arranged in a same layer as the source and drain of the thin film transistor.

3. The array substrate of claim 2, wherein,
each first segment of the first data line is provided with fourth via holes which are arranged at both ends of each first segment in the extending direction of the first data line, and penetrate a passivation layer of the thin film transistor;
each second segment of the first data line is provided with fifth via holes which are arranged at both ends of the second segment in the extending direction of the first data line, and penetrate a gate insulating layer and the passivation layer; and
the second electrically connecting part is electrically connected with each first segment of the first data line and the second segment adjacent with the first segment, through the fourth via holes and the fifth via holes.

4. The array substrate of claim 1, wherein,
the second electrically connecting part is arranged in a same layer as the pixel electrode of each sub-pixel unit.

5. The array substrate of claim 1, wherein,
the second data line comprises first segments and second segments which are arranged alternately in an extending direction of the second data line;
the first segments of the second data line and the first segments of the first data line are arranged side by side, and are arranged in a same layer as the gate of the thin film transistor;
the second segments of the second data line and the second segments of the first data line are arranged side by side, and are arranged in a same layer as the source and drain of the thin film transistor; and
the first segments of the second data line are electrically connected with the second segments of the second data line through a third electrically connecting part.

6. The array substrate of claim 5, wherein,
each first segment of the second data line is provided with sixth via holes at both ends in the extending direction of the second data line, and the sixth via holes penetrate a gate insulating layer and a passivation layer of the thin film transistor;
each second segment of the second data line is provided with seventh via holes at both ends in the extending direction of the second data line, and the seventh via holes penetrate the passivation layer; and
the third electrically connecting part electrically connects each first segment of the second data line with the second segment adjacent with the first segment, through the sixth via holes and the seventh via holes.

7. The array substrate of claim 5, wherein,
the third electrically connecting part is arranged in a same layer as the pixel electrode of each sub-pixel unit.

8. A display panel, comprising the array substrate of claim 1.

9. A display device, comprising the display panel of claim 8.

* * * * *